(12) United States Patent
Haghzadeh et al.

(10) Patent No.: US 10,287,446 B2
(45) Date of Patent: May 14, 2019

(54) FERROELECTRIC NANOCOMPOSITE BASED DIELECTRIC INKS FOR RECONFIGURABLE RF AND MICROWAVE APPLICATIONS

(71) Applicant: University of Massachusetts, Boston, MA (US)

(72) Inventors: Mahdi Haghzadeh, Lowell, MA (US); Alkim Akyurtlu, Arlington, MA (US); Craig Armiento, Acton, MA (US)

(73) Assignee: University of Massachusetts, Boston, MA (US)

(*) Notice: Subject to any disclaimer, the term of this patent is extended or adjusted under 35 U.S.C. 154(b) by 0 days.

(21) Appl. No.: 15/804,306

(22) Filed: Nov. 6, 2017

(65) Prior Publication Data

US 2018/0072901 A1 Mar. 15, 2018

Related U.S. Application Data

(63) Continuation of application No. 15/203,706, filed on Jul. 6, 2016, now Pat. No. 9,809,720.

(60) Provisional application No. 62/189,054, filed on Jul. 6, 2015, provisional application No. 62/357,985, filed on Jul. 2, 2016, provisional application No. 62/358,705, filed on Jul. 6, 2016.

(51) Int. Cl.
| | |
|---|---|
| *H05K 1/16* | (2006.01) |
| *C09D 11/102* | (2014.01) |
| *C09D 11/03* | (2014.01) |
| *C09D 11/033* | (2014.01) |
| *H01P 3/00* | (2006.01) |
| *H01P 1/18* | (2006.01) |
| *H01Q 21/06* | (2006.01) |

(52) U.S. Cl.
CPC ............ *C09D 11/102* (2013.01); *C09D 11/03* (2013.01); *C09D 11/033* (2013.01); *H01P 1/181* (2013.01); *H01P 3/00* (2013.01); *H01Q 21/065* (2013.01); *H05K 1/16* (2013.01); *H05K 1/162* (2013.01); *H05K 2201/086* (2013.01)

(58) Field of Classification Search
CPC ......... H05K 1/16; H01L 41/187; C01G 49/02
USPC ......... 174/254; 428/402; 310/311; 423/594.1
See application file for complete search history.

(56) References Cited

U.S. PATENT DOCUMENTS

| | | | | |
|---|---|---|---|---|
| 5,065,068 A | * | 11/1991 | Oakley ..................... | B06B 1/06 310/334 |
| 5,439,768 A | * | 8/1995 | Matsuo ..................... | G03G 5/02 386/E5.055 |

(Continued)

*Primary Examiner* — Xiaoliang Chen
(74) *Attorney, Agent, or Firm* — Armis IP Law, LLC

(57) ABSTRACT

A novel ferroelectric ink comprising multiphase Barium Strontium Titanate (BST) in a polymer composite is described. The ink can be employed using direct-ink writing techniques to print high dielectric constant, low loss, and electrostatically-tunable dielectrics on substrates. The substrates can be flexible such as plastics or rigid, such as substrates comprising semiconductor materials or ceramics and the like. The dielectric ink is made by suspending pre-sintered nano/submicron-sized particles of BST in a thermoplastic polymer with a solvent. After printing with the ink, a low temperature curing process is performed at temperatures below 200° C., a temperature too low to sinter BST. Fully printed devices, such as a varactor and a phase shifter using direct ink writing methodologies are described.

28 Claims, 13 Drawing Sheets

(56) References Cited

U.S. PATENT DOCUMENTS

| | | | | |
|---|---|---|---|---|
| 5,731,116 | A * | 3/1998 | Matsuo | G11B 9/08 386/E5.055 |
| 6,525,144 | B1 | 2/2003 | Tanahashi | |
| 7,015,256 | B2 | 3/2006 | Ito | |
| 7,585,474 | B2 * | 9/2009 | Wong | B82Y 25/00 423/1 |
| 7,955,266 | B2 | 6/2011 | Casula | G10K 11/346 310/334 |
| 8,890,543 | B2 * | 11/2014 | Steeneken | H01G 5/16 257/532 |
| 9,058,912 | B2 | 6/2015 | Hara | |
| 9,487,445 | B2 * | 11/2016 | Natsui | C01G 49/0036 |
| 9,673,379 | B2 * | 6/2017 | Murakami | G02B 7/10 |
| 2002/0132898 | A1 * | 9/2002 | Takaya | H01B 3/442 524/445 |
| 2002/0193236 | A1 * | 12/2002 | Takaya | C04B 35/6262 501/126 |
| 2002/0193462 | A1 * | 12/2002 | Angeletakis | A61K 6/0073 523/115 |
| 2002/0197461 | A1 * | 12/2002 | Takaya | B32B 18/00 428/210 |
| 2004/0051795 | A1 * | 3/2004 | Ajioka | G06K 9/00234 348/239 |
| 2004/0227705 | A1 * | 11/2004 | Fujimoto | C09K 11/02 345/76 |
| 2004/0262210 | A1 * | 12/2004 | Westervelt | B01L 3/502761 210/222 |
| 2005/0019592 | A1 * | 1/2005 | Bai | H01G 4/18 428/461 |
| 2005/0101714 | A1 * | 5/2005 | Yamasaki | H01G 4/206 524/406 |
| 2005/0130446 | A1 * | 6/2005 | Takaya | H01B 3/442 438/780 |
| 2005/0130447 | A1 * | 6/2005 | Takaya | H01B 3/442 438/780 |
| 2005/0154110 | A1 * | 7/2005 | Takaya | H01B 3/442 524/413 |
| 2006/0074164 | A1 * | 4/2006 | Slenes | C08K 3/34 524/413 |
| 2006/0102487 | A1 * | 5/2006 | Parsons, II | C25D 7/00 205/183 |
| 2006/0120020 | A1 * | 6/2006 | Dowgiallo, Jr. | H01G 4/12 361/313 |
| 2006/0159927 | A1 | 7/2006 | Hara | |
| 2006/0237717 | A1 * | 10/2006 | Bai | H01G 4/18 257/40 |
| 2007/0039814 | A1 * | 2/2007 | Maggard | B01J 21/063 204/157.15 |
| 2007/0087929 | A1 * | 4/2007 | Park | H01G 4/206 501/100 |
| 2007/0149668 | A1 * | 6/2007 | Satou | C08K 5/06 524/376 |
| 2008/0020231 | A1 | 1/2008 | Yamada | |
| 2008/0025593 | A1 * | 1/2008 | Ajioka | G06K 9/00234 382/141 |
| 2008/0060743 | A1 * | 3/2008 | Minamikawa | H01G 4/1209 156/89.12 |
| 2009/0022999 | A1 * | 1/2009 | Wuu | C08K 3/34 428/447 |
| 2009/0066433 | A1 * | 3/2009 | Yamamoto | H03B 5/366 331/182 |
| 2010/0027192 | A1 | 2/2010 | Perry | |
| 2010/0051917 | A1 | 3/2010 | Kippelen | |
| 2010/0246010 | A1 * | 9/2010 | Mitamura | G01J 3/02 359/579 |
| 2011/0221302 | A1 * | 9/2011 | Yabuta | C01G 49/0018 310/311 |
| 2013/0021764 | A1 | 1/2013 | Yeo | |
| 2013/0152683 | A1 * | 6/2013 | Noh | G01V 7/04 73/504.12 |
| 2014/0178290 | A1 * | 6/2014 | Yabuta | C01G 49/0018 423/594.1 |
| 2014/0239738 | A1 | 8/2014 | Koyama | |
| 2015/0140296 | A1 * | 5/2015 | Matsushima | C08L 53/02 428/209 |
| 2015/0162104 | A1 * | 6/2015 | Soininen | G21B 3/002 376/108 |
| 2015/0183992 | A1 | 7/2015 | Zeng | |
| 2015/0189745 | A1 | 7/2015 | Zeng | |
| 2015/0189747 | A1 | 7/2015 | Zeng | |
| 2015/0240055 | A1 | 8/2015 | Zeng | |
| 2015/0263325 | A1 * | 9/2015 | Honda | H01M 10/0525 429/145 |
| 2015/0349239 | A1 * | 12/2015 | Murakami | G02B 7/10 428/402 |

* cited by examiner

FERROELECTRIC NANOCOMPOSITE BASED DIELECTRIC INKS FOR RECONFIGURABLE RF AND MICROWAVE APPLICATIONS

CROSS-REFERENCE TO RELATED APPLICATIONS

This application is a continuation application of U.S. patent application Ser. No. 15/203,706 filed Jul. 6, 2016, the entire teachings of which are incorporated herein by reference.

U.S. patent application Ser. No. 15/203,706 claims the benefit of U.S. provisional patent application Ser. No. 62/189,054, filed Jul. 6, 2015, and of U.S. provisional patent application Ser. No. 62/357,985, filed Jul. 2, 2016, and of U.S. provisional patent application Ser. No. 62/358,705, filed Jul. 6, 2016, each of which applications is incorporated herein by reference in its entirety.

THE NAMES OF THE PARTIES TO A JOINT RESEARCH AGREEMENT

This invention resulted from work under a joint research agreement between the University of Massachusetts Lowell and the Raytheon Company.

BACKGROUND OF THE INVENTION

Enabled by freedom and capacity of printed electronics with the promises of low cost and rapid manufacturing of light weight and flexible electronic circuits, printed Radio Frequency (RF) and Microwave (MW) devices such as filters, transistors, switches and antennas are emerging with different form factors. Tunability is an important functionality in various adaptive RF and MW applications such as phased array antennas, conformal antennas, and tunable frequency selective surfaces.

Ferroelectric varactors are of special interest for RF and microwave applications due to their higher performance, and reduced power consumption, size and cost. Among various ferroelectric materials, Barium Strontium Titanate ($Ba_xSr_{1-x}TiO_3$, or BST), a perovskite-type compound, is the material of choice since its Curie temperature, $T_C$, is controllable by the Ba fraction. For $x<0.7$, $T_C$ is below room temperature, hence BST is in the paraelectric (nonpolar) phase at room temperature and is characterized by high dielectric constant, high tunability, low loss tangent, and high switching speed. In addition, its relative permittivity is decreased in a nonlinear fashion with no hysteresis when a bias voltage is applied. In conventional parallel-plate or coplanar-plate varactors, BST is usually used in form of thin or thick ceramic films. From the printed electronics perspective, utilizing BST in the form of ceramic films is impractical since they are brittle in nature and their fabrication require sintering at extremely high temperatures (>850° C.), which is unfeasible on plastic substrates, as well as in many semiconductor processing applications.

One promising solution to this problem may be a multiphase BST/polymer composite made by suspending micro- or nano-BST particles in a polymer matrix. Such a solution is a compromise between the processing flexibility of a polymer and the desired ferroelectric properties of BST. The fabrication and material properties of many BST/polymer composites have been reported using various polymers such as silicon-rubber, polymethylmethacrylate (PMMA), polyphenylene sulfide (PPS), and cyclic olefin copolymer (COC). However, these studies utilized plastic extrusion and injection molding. Moreover, none of these studies reported characterization of BST/polymer dielectrics at frequencies above 1 GHz.

There is a need for printed tunable elements that can be fabricated on various substrates, including flexible substrates.

SUMMARY OF THE INVENTION

According to one aspect, the invention features a liquid ink, comprising a plurality of pre-sintered perovskite oxide particles, the plurality of pre-sintered perovskite oxide particles having a size distribution with a modal size in the range of 30 nm to 2000 nm; a thermoplastic polymer configured to have a low loss tangent less than 0.001 at high frequencies; a solvent configured to dissolve the polymer; and a dispersant configured to disperse the plurality of pre-sintered perovskite oxide particles.

In one embodiment, the pre-sintered perovskite oxide particles comprise $Ba_xSr_{(1-x)}TiO_3$, with x in the range of $0.0 \le x \le 1.0$.

In another embodiment, the pre-sintered perovskite oxide particles comprise $Ba_xSr_{(1-x)}TiO_3$, with x in the range of $0.5 \le x \le 0.7$.

In yet another embodiment, the polymer is a polymer selected from the group of polymers consisting of Topas Cyclic Olefin Copolymer, PTFE (Teflon), silicone rubber, butyl-rubber, epoxy resin, polymethylmethacrylate (PMMA), polyphenylene sulfide (PPS), Polystyrene (PS), Polyethylene (PE), Parylene C & N, and olypropylene-graft-poly(styrene-stat-divinylbenzene) (ER).

In still another embodiment, the solvent is a solvent selected from the group of solvents consisting of xylene, toluene, and Tetrahydrofuran (THF).

In a further embodiment, the dispersant is 4-tert-butycatechol.

According to another aspect, the invention relates to a composition of matter, comprising a plurality of pre-sintered perovskite oxide particles, the plurality of pre-sintered perovskite oxide particles having a size distribution with a modal size in the range of 30 nm to 2000 nm, the plurality of pre-sintered perovskite oxide particles embedded in a thermoplastic polymer configured to have a low loss tangent less than 0.001 at high frequencies.

In one embodiment, the plurality of pre-sintered perovskite oxide particles comprise $Ba_xSr_{(1-x)}TiO_3$, with x in the range of $0.0 \le x \le 1.0$.

In another embodiment, the plurality of pre-sintered perovskite oxide particles comprise $Ba_xSr_{(1-x)}TiO_3$, with x in the range of $0.5 \le x \le 0.7$.

In yet another embodiment, the polymer is a polymer selected from the group of polymers consisting of Topas Cyclic Olefin Copolymer, PTFE (Teflon), silicone rubber, butyl-rubber, epoxy resin, polymethylmethacrylate (PMMA), polyphenylene sulfide (PPS), Polystyrene (PS), Polyethylene (PE), Parylene C & N, and olypropylene-graft-poly(styrene-stat-divinylbenzene) (ER).

In still another embodiment, the modal size is correlated with a tunable response.

In a further embodiment, the tunable response is configured to be controlled with an applied voltage.

In yet a further embodiment, the plurality of pre-sintered perovskite oxide particles are disconnected one from the other, and the thermoplastic polymer forms a three dimensional matrix.

According to another aspect, the invention relates to an apparatus, comprising a substrate; a first electrically conductive structure and a second electrically conductive structure, at least one of the first electrically conductive structure and the second electrically conductive structure in contact with the substrate, the first electrically conductive structure and the second electrically conductive structure each having at least one terminal, the first electrically conductive structure and the second electrically conductive structure spaced apart from each other so as to define a channel; and an electrically nonconductive filler comprising a plurality of pre-sintered perovskite oxide particles, the plurality of pre-sintered perovskite oxide particles having a size distribution with a modal size in the range of 30 nm to 2000 nm; and a polymer configured to have a low loss tangent less than 0.001 at high frequencies; the electrically nonconductive filler situated within the channel.

In one embodiment, the substrate is a flexible substrate.

In another embodiment, the apparatus is configured to operate under the application of a tunable signal selected from the group of signals consisting of radio frequency signals and microwave signals.

In yet another embodiment, the apparatus is configured to operate so as to provide a tunable signal selected from the group of signals consisting of radio frequency signals and microwave signals.

In still another embodiment, the first electrically conductive structure and the second electrically conductive structure are situated in a common plane.

In a further embodiment, the first electrically conductive structure and the second electrically conductive structure are interdigitated.

In yet a further embodiment, the first electrically conductive structure and the second electrically conductive structure are situated in parallel planes.

In an additional embodiment, the apparatus is configured to operate as an apparatus selected from the group consisting of a varactor, a tunable phase shifter, a reconfigurable antenna, an adaptive antenna, a steerable phased array, a tunable filter, a tunable Frequency Selective Surface (FSS), a tunable match line, a tunable Substrate Integrated Waveguide (SIW), and a Voltage Controlled Oscillator (VCO).

According to another aspect, the invention relates to a method of making an ink, comprising the steps of providing a plurality of pre-sintered perovskite oxide particles having a size distribution with a modal size in the range of 30 nm to 2000 nm; providing a solvent and a dispersant; producing a mixture of the plurality of pre-sintered perovskite oxide particles, the solvent and the dispersant; adding a thermosetting polymer to the mixture; and agitating the mixture and the thermosetting polymer for a duration long enough to dissolve the polymer in the solvent.

According to another aspect, the invention relates to a method of making an apparatus, comprising the steps of providing a flexible substrate having a surface; situating at least a first electrically conductive structure on the surface of the substrate, the first electrically conductive structure having at least one terminal; and providing in any order a second electrically conductive structure having at least one terminal, the second electrically conductive structure spaced apart from the first electrically conductive structure so as to define a channel there between; and a composition of matter comprising a plurality of pre-sintered perovskite oxide particles, the plurality of pre-sintered perovskite oxide particles having a size distribution with a modal size in the range of 30 nm to 2000 nm, the plurality of pre-sintered perovskite oxide particles embedded in a thermoplastic polymer configured to have a low loss tangent less than 0.001 at high frequencies and situated within the channel.

In one embodiment, at least one of the steps is performed using a process selected from the group of processes consisting of printing, injection molding, compression molding, solution processing, and roll-to-roll manufacturing.

In another embodiment, the step of providing the second electrically conductive structure is performed before the step of providing the composition of matter.

In yet another embodiment, the step of providing the second electrically conductive structure is performed after the step of providing the composition of matter.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

A fully printed varactor and a phase shifter using direct ink writing methodologies are described. A novel ferroelectric ink was developed and was employed using direct-ink writing techniques to print high dielectric constant, low loss, and electrostatically-tunable dielectrics on plastic substrates. It is believes that similar methods can be used on substrates that are not flexible, such as substrates comprising semiconductor materials or ceramics and the like. The dielectric is based on multiphase Barium Strontium Titanate (BST)/polymer composite made by suspending pre-sintered nano/submicron-sized particles of BST in a thermoplastic polymer, namely Cyclic Olefin Copolymer (COC). After printing with the ink, a low temperature curing process was performed at temperatures below 200° C., a temperature too low to sinter BST. RF measurements and characterizations showed that the sinter-less dielectric had a very high relative permittivity of $\varepsilon_r$=40 and a very low dielectric loss of tan $\delta$=0.0005 at f=10 GHz. In other embodiments, a very low dielectric loss of tan $\delta$=0.0001 at f=10 GHz has been observed. As a result, all-printed, voltage-variable capacitors with up to 10% capacitance tunability at microwave frequencies were realized. In one embodiment, the tunable BST/COC ink was used in a left handed transmission line design to realize a printed tunable phase shifter.

We describe the development and characterization of electrostatically tunable, sinter-less BST/COC dielectrics based on a BST ink for microwave frequencies that were printed using direct-ink writing techniques. The dielectrics were exploited to achieve fully printed varactors on flexible substrates with up to 10% capacitance tunability at microwave frequencies. Two novel capacitor designs were introduced and fabricated: cylindrical capacitor (CV) and inter-digitated capacitor (IDC). These capacitors were used as device under test (DUT) in parameter-related, one-probe RF measurements. The value of this new ink and the tunable sinter-less dielectric was demonstrated by printing a Left Handed Transmission Line (LHTL) tunable phase shifters.

To the inventors' best knowledge, there is no report of dielectric or capacitance tunability for sinter-less BST/polymer composites with nano/submicron sized BST particles (nor with any other ferroelectric ceramic fillers).

BST/Polymer Ink

Figure 1:
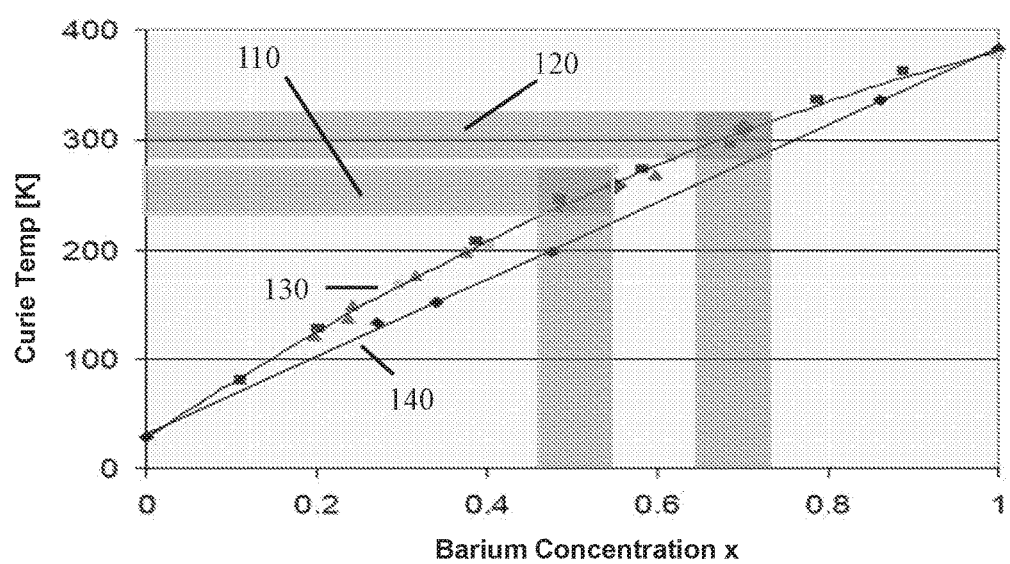
FIG. 1 is a graph that illustrates the Curie temperature as a function of Ba fraction for various BST materials (courtesy of Ferro Co., USA), and composition windows for micro- and nano-sized BST for optimum performance.

As the Ba mole fraction (x) in $Ba_xSr_{1-x}TiO_3$ increases, the Curie temperature, $T_C$, increases, as seen in FIG. 1. For ferroelectric material, the higher the dielectric constant the higher the tunability. The relative permittivity of BST peaks at $T_C$, but placing $T_C$ very close to room temperature would result in excessive temperature sensitivity. Considering these criteria, a composition window could be identified for BST for optimum performance One could identify x=0.5 as the ideal Ba fraction choice with $T_C$=240K (−33° C.) and the corresponding operational range of 280-340K (7-67° C.) for BST ceramics, as shown in FIG. 1 with bar 110 representing micro sized particles and bar 120 representing nano-sized particles. The curve 130 illustrates the relationship between the Barium concentration x and the Curie temperature for various polycrystalline BST samples, and the curve 140 illustrates the relationship between the Barium concentration x and the Curie temperature for various single crystal BST samples. During the sintering in conventional BST ceramic processing, particles are diffused to each other and grow to micron size particles. However, no sintering is performed at the low temperatures used in processing the multiphase BST/polymer materials. Therefore, BST particles possess their original powder sizes and are distributed as isolated inclusions in the polymer matrix. For a specific Ba fraction, as the particles get smaller, their $T_C$ decreases. For sizes smaller than a threshold size (about few hundred nm), $T_C$ drops significantly (about 60K), thereby resulting in very low permittivity values and consequently negligible or no tunability at room temperatures. This reduction in $T_C$ can be compensated by increasing the Ba mole fraction. Whereas 240K was the ideal $T_C$ for micron sized particles; a $T_C$=240+60=300K might be the new ideal for submicron- and nano-sized particles, which corresponds to x=0.68. It has been demonstrated that the relative permittivity of BST nano particles peaks at x=0.67 with $\varepsilon_r$=341 at room temperature. For x=0.68, the operational temperature range would be 280-340K (7-67° C.) and a corresponding composition window of 0.63-0.73, as shown with bar 120 in FIG. 1. Therefore, a principle that tends towards tunability in BST/polymer composites without sintering is that the Ba fraction in BST should preferably be selected higher than normally used in ceramic or bulk BST where sintering is applied. $Ba_{0.67}Sr_{0.33}TiO_3$ powders with particle size of around 200 nm were manufactured by TPL, Inc., (Albuquerque, Minn., USA). In one embodiment, a ferroelectric BST ink was developed by mixing the BST particles with 4-tert-butycatechol (BTC) as a dispersant, and a thermoplastic Cyclic Olefin Copolymer (COC) in toluene as the solvent.

Figure 2:
FIG. 2 is an image of a quantity of BST ink according to principles of the invention.

FIG. 2 is an image of a quantity of BST ink according to principles of the invention. Table 1 lists the typical properties of the ink in uncured form as a s a cured printed dielectric.

TABLE 1

Typical Properties of the Ink

| Uncured Ink | | Cured Printed Dielectric | |
|---|---|---|---|
| Appearance | Milky White | Curing Temperature | <200° C. |
| BST particle size | ≈50 nm | Appearance | Grey |
| BST Loading | 70 vol. % (=92 wt. %) | Dielectric Constant ($\varepsilon_r$) | 52 at 10 GHz |
| Polymer | COC 5013 | Loss Tangent (tan$\delta$) | 0.002 at 10 GHz |
| Solvent | Toluene | Substrate Adhesion | Excellent |
| Viscosity | 10 cP | Dielectric Strength | 25 V/μm |
| Storage | Room temperature, on a tube roller | Dielectric Tunability ($\tau$) | 10% at 10 GHz (E = 5 V/μm with 70 μm gap) |
| Shelf Life | 6 months | Flexibility | Excellent |

Nano BST ink is a novel ferroelectric ink to deliver sinterless, electrostatically tunable, high dielectric constant, and low loss dielectrics at microwave frequencies using direct-ink writing methodologies such as inkjet printing, Aerosol Jet printing, or micro-pen dispensing techniques, and additive manufacturing technologies such as stamping, screen printing, or coating techniques. After printing with the ink, only a curing process is required at temperatures below 200° C., thus allowing fabrication on flexible, plastic substrates.

The sinter-less dielectric composite has a very high dielectric constant of $\varepsilon_r=52$, a very low loss tangent of tan δ in the range of 0.0001 to 0.002, and a dielectric tunability of τ=10% at 10 GHz. This allows for realizing an all-printed high-frequency voltage variable capacitor on a flexible substrate to be used in tunable RF and microwave applications such as phased array antennas, conformal antennas, and tunable frequency selective surfaces. As used herein, unless otherwise described, the term "high frequency" is intended to denote the range of frequencies from 300 MHz to 300 GHz, including the RF, microwave and millimeter-wave frequencies.

Composites are a combination of an active material such as piezoelectric ceramics and a passive material such as a polymer or epoxy. One basic relationship between the active and passive material is commonly referred to as connectivity. Connectivity is a convenient notation for illustrating the number of dimensions through which a material is continuous. Connectivity of a piezoelectric composite is shown as a combination of two numbers such as 1-3, 2-2 or 0-3 where the first digit represents the active material and the second digit represents the passive material. In 0-3 composites, the piezoelectric material is substantially discontinuous in each of three orthogonal directions, and the polymer or epoxy matrix is continuous in all three orthogonal directions. The inks of the present invention are 0-3 composites when printed and cured.

Method of Making Ink

Probe sonication was used to disperse BST particles in a solvent before adding a polymer. It is believed that other methods for agitation may also be used to disperse the BST particles. As BST particles have very high molar mass, density and surface energy, they tend to agglomerate very fast and settle quickly as sonication is stopped. Therefore, a dispersant or surfactant is helpful to disperse BST particles in the solvent. The dispersant of choice was 4-tert-butyl-cathechol (BTC). BTC is a non-covalent dispersant that is used to prevent settling of heavy BST particles as it is highly soluble in toluene and its catechol structure interacts with BST particles.

New BST powders with Ba:Sr=67:33 (i.e. x=67) at three sizes of 800, 200, and 100 nm were purchased from TPL Inc., (Albuquerque, Minn., USA). These samples will be referred as HBS800, HBS200, and HBS100, respectively.

First, BST submicron-/nano-powders were mixed with 4-tert-butycatechol (BTC) in Toluene. Next, the mixture was agitated with a probe sonicator (Q500 Sonicator, QSonica, USA) for 15 min with 30% power in order to disperse the BST powders and break down their agglomerates. Finally, the polymer was added to the suspension. The mixture was left on a tube roller for 24 hours so that polymer was dissolved in Toluene. Then, the developed ferroelectric nano-ink is ready to use.

In order to obtain dielectric tunability from such an ink after printing and curing, it is important to reach specific loading of BST material as well. The minimum required amount of dispersant, BTC, were calculated based on the density and specific surface area values of BST, and it was found that as small as 0.005 g of BTC is enough to keep the BST particles dispersed in toluene for about half an hour, long enough to perform the printing.

The weight ratios for the mixture are calculated as follows in one embodiment. A BST volume fraction, $v_{BST}$, is assumed. Using the density of BST, one can calculate mass of BST as, $m_{BST}=v_{BST}\times d_{BST}$; hence, $m_{COC}=(1-v_{BST})\times d_{COC}$. The mass ratio of BST and COC is found as, $\beta=m_{BST}/m_{COC}$. Next, a 1.25 g solid in 25 mL of toluene is assumed, which is the sum of weight of BST, $wt_{BST}$, and weight of COC, $wt_{COC}$—i.e. $wt_{BST}+wt_{COC}=(1+\beta)\ wt_{COC}=1.25$ g. Therefore, $wt_{COC}=1.25\ g/(1+\beta)$ and $wt_{BST}=\beta\times wt_{COC}$.

Next, the amount of BTC required for dispersing this amount of BST is calculated. Using the Total Surface Area of BST, SSA, one can find the total surface of BST: $S_{BST}=SSA\times wt_{BST}$. Volume of required BTC, $v_{BTC}$ can be found using the thickness of BTC coating: $v_{BTC}=S_{BST}\times t$. A coating of one molecule, t=10 nm (one molecule thick) is considered. Now, the weight of BTC can be found for the mixing using its density: $wt_{BTC}=v_{BTC}\times d_{BTC}$. Using the mixed weights, i.e. $wt_{BST}$, $wt_{COC}$, and $wt_{BTC}$, and the density values, the corresponding volume values in the final mixture can be obtained. Finally, the BST vol. % loading can be calculated using these volume values. Table 2 summarizes the quantities required for these calculations.

TABLE 2

|  | BST | COC | BTC | Toluene |
|---|---|---|---|---|
| Molecular Weight (g/mol) | 433.5 |  | 166.22 | 92.14 |
| Density | 5.33 g/mL | 1.02 g/cm3 | 1.08 g/mL = 1.08E6 g/m3 | 0.8669 g/cm3 |
| Specific Surface Area (m2/g) | HBS800 1.92 HBS200 4.36 HBS100 18.3 |  |  |  |
| Tg |  | 130° C. | 141° C. | 231° F. = 110.6° C. (Boiling point) |

Ferroelectric Ink Samples

Different BST/COC inks were prepared to study effects of loading, BST size and Ba fraction on dielectric properties. Two BST powders were used for the inks. The first BST powder was $Ba_{0.5}Sr_{0.5}TiO_3$ (Sigma Aldrich, USA) with a particle size of approximately 100 nm. This powder is referred as BST100. The other BST powders were $Ba_{0.67}Sr_{0.33}TiO_3$ (TPL Inc., USA) with 800 nm, 200 nm, and 50 nm particle sizes. These powders are referred as HBS800, HBS200, and HBS100, respectively.

For the inks, the BST100, HBS800 and HBS200 powders were mixed with 80 vol. % loading in COC; whereas, the HBS100 powder was mixed with 20, 50, and 80 vol. % ratios with COC. Thermogravimetric Analysis (TGA, TA Instruments TGA Q-500) was performed on the inks to measure the BST loading. Table 3 lists the mixing ratios for inks with different loading, different particles, and different Ba fraction in BST composition.

TABLE 3

| Powder | Targeted: BST vol. % | BST wt. [g] | COC wt. [g] | BTC wt. [g] | TGA: BST wt. % | TGA: BST Vol. % |
|---|---|---|---|---|---|---|
| HBS100 | 20% | 0.7080 | 0.5420 | 0.0140 | 48.27% | 15.15% |
|  | 50% | 1.0492 | 0.2008 | 0.0207 | 77.52 | 33.56% |
|  | 80% | 1.1930 | 0.0571 | 0.0236 | 92.7 | 70.85% |

TABLE 3-continued

| Powder | Targeted: BST vol. % | BST wt. [g] | COC wt. [g] | BTC wt. [g] | TGA: BST wt. % | TGA: BST Vol. % |
|---|---|---|---|---|---|---|
| HBS200 | 80% | 1.1930 | 0.0571 | 0.0056 | 93.84 | 74.46% |
| HBS800 | 80% | 1.1930 | 0.0571 | 0.0025 | 95.66 | 80.84% |
| BST100 | 80% | 1.1883 | 0.0617 | 0.0235 | 90.54 | 64.68% |

Notes:
1) HBS refers to $Ba_{0.67}Sr_{0.33}TiO_3$,
2) BST refers to $Ba_{0.5}Sr_{0.5}TiO_3$,
3) Number after HBS refers to particle size in nm.

Printing with Ferroelectric Nano-Ink

BST/COC dielectrics were printed using an ultrasonic controlled fluid dispenser, GIX Microplotter II (Sonoplot Inc.). After printing, only a curing step at 200° C. is required to evaporate the toluene solvent and solidify the BST/COC nanocomposite. Tunable BST/polymer nano-ink was printed on interdigitated and cylindrical capacitors with the Sonoplot printer. It is believed that many other types of printing can also be used to print such devices, including direct-ink writing methodologies such as inkjet printing, Aerosol Jet printing, or micro-pen dispensing techniques, and additive manufacturing technologies such as stamping, screen printing, or coating techniques.

Method of Making a Varactor

The process involves the provision of a substrate upon which to make a varactor. In some embodiments, the substrate can be a flexible substrate, such as a plastic sheet. In some embodiments, the substrate can be a rigid substrate, such as a semiconductor wafer or a ceramic. In an embodiment where the capacitor is going to be fabricated with both conductors in the same plane, such as an interdigitated capacitor or a cylindrical capacitor, the conductors are deposited on the substrate and are patterned as required. Each conductor has an electrical terminal. The liquid BST ink is deposited in the spaces between the conductors. Any convenient method of depositing the liquid BST ink may be used, as previously described. In some embodiments, an electrical field optionally can be applied between the two capacitor conductors so as to pole or orient the BST particles in the liquid ink prior to and/or during the curing step. The BST ink is then cured by heating to a temperature of approximately 200° C.

In embodiments where the capacitor will be a parallel plate capacitor, a first capacitor conductor having an electrical terminal is deposited on the substrate. The liquid BST ink is then printed or otherwise deposited by any convenient method on the first capacitor conductor. The liquid BST ink is cured by heating to a temperature of approximately 200° C. A second capacitor conductor having an electrical terminal is deposited on the cured BST ink. The cured BST ink provides a thickness representing the distance between the two parallel plate capacitor conductors.

Fully Direct-Ink Printed Varactors

Figure 3A:
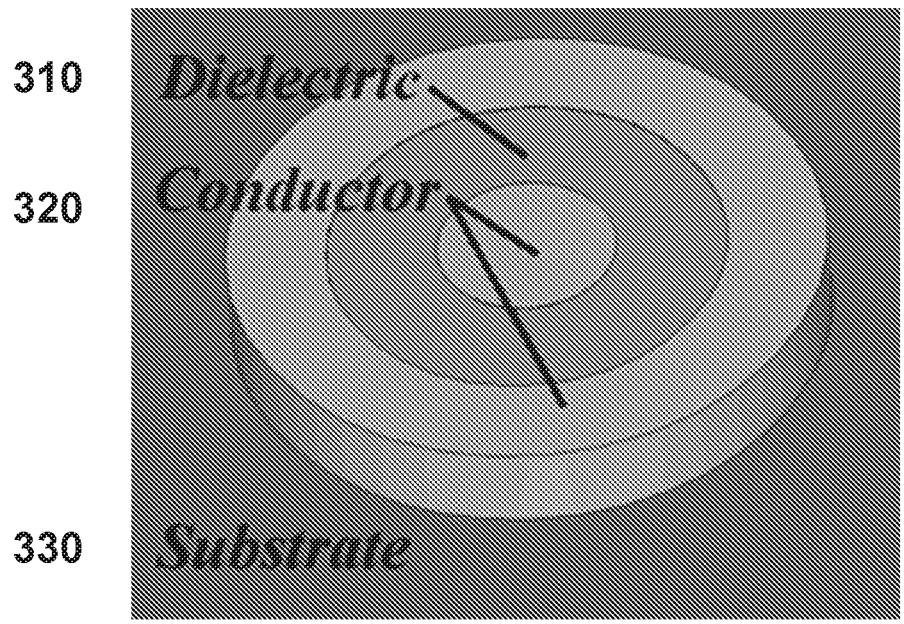
FIG. 3A is an image of the design model of a fully printed cylindrical varactor

Several different varactor designs based on the tunable BST/COC ink were printed. The varactors are used as DUTs for a parameter-related RF measurement. The first varactor design is a printed cylindrical varactor on a substrate 330, where two concentric conductive cylinders 320 are fabricated by an additive manufacturing method and the dielectric material 310 is filled in the cylindrical gap between the conductors (see FIG. 3A). Such capacitors have a capacitance given by $$C = 2\pi\varepsilon_0\varepsilon_r \frac{h}{\ln\left(\frac{R_{out}}{R_{in}}\right)}$$

where $R_{out}$ is the outside radius of the ink, $R_{in}$ is the inside radius of the ink, h is the height (or thickness) of the ink (and of the electrodes), $\varepsilon_r$ is the complex permittivity, and $\varepsilon_0$ is the permittivity of free space. The capacitance equation can be manipulated to express the complex permittivity in terms of observable parameters and known constants as $$\varepsilon_r = \frac{\ln\left(\frac{R_{out}}{R_{in}}\right)}{2\pi\varepsilon_0 h} C.$$

The second design is an interdigital (IDC) capacitance equipped with a coplanar waveguide (CPW) to enable GSG probe reflection measurements (see FIG. 3C). a substrate 360 supports interdigitated conductors 350 that are filled with the dielectric material 340. Such capacitors have a capacitance given by $$C = \varepsilon_0\varepsilon_r \frac{(n-1)hL}{g}$$

where n−1 is the number of interdigitated fingers, L is the length of the ink between two interdigitated fingers, g is the width of the ink between two fingers, h is the height (or thickness) of the ink (and of the electrodes), $\varepsilon_r$ is the complex permittivity, and $\varepsilon_0$ is the permittivity of free space. The capacitance equation can be manipulated to express the complex permittivity in terms of observable parameters and known constants as $$\varepsilon_r = \frac{g}{\varepsilon_0(n-1)hL} C.$$

Figure 3B:
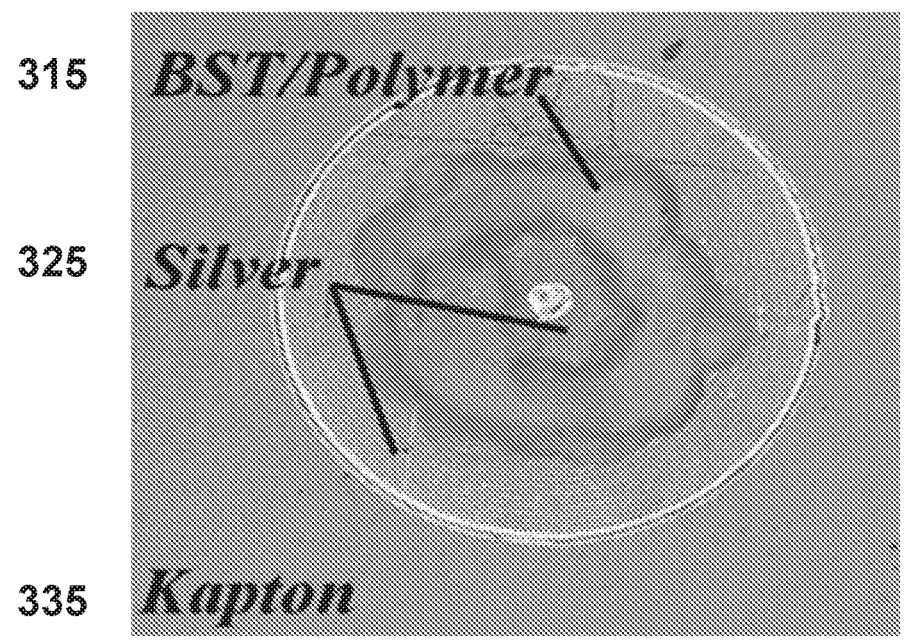
FIG. 3B is an image of a fully printed cylindrical varactor.
Figure 3C:
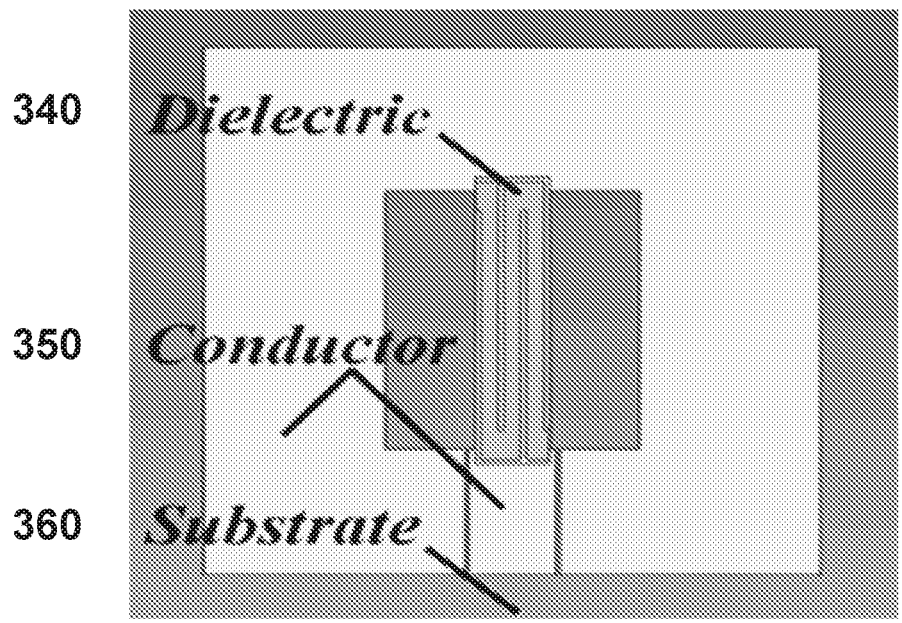
FIG. 3C is an image of the design model of a fully printed interdigitated varactor.
Figure 3D:
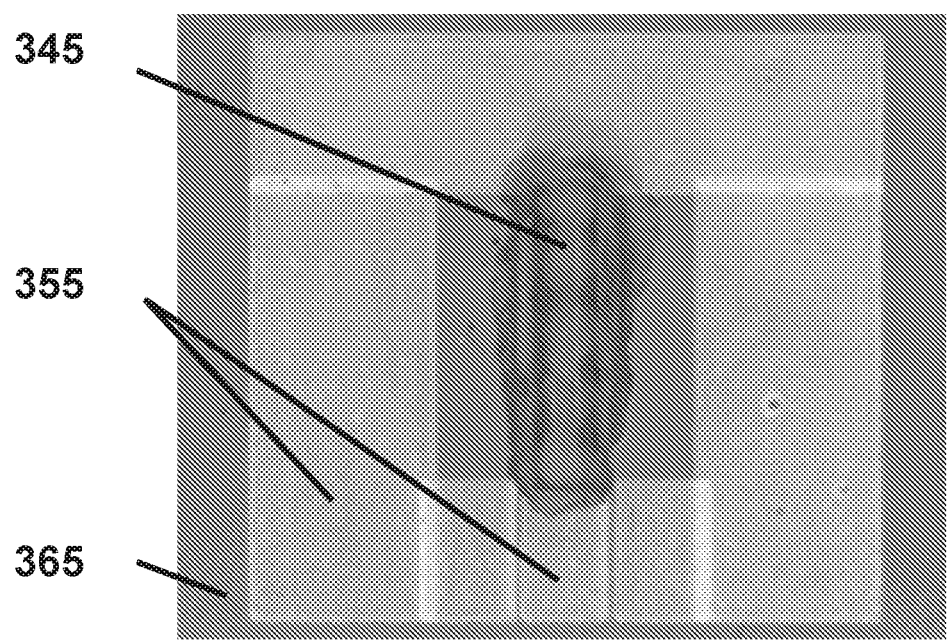
FIG. 3D is an image of a fully printed interdigitated varactor.

Printed samples of these varactors are shown in FIG. 3B and FIG. 3D, respectively. The conductive features (325, 355) of DUTs were printed using nano-silver ink (PG-007, Paru Co., Korea) with an Aerosol Jet printer (200 Series Systems, Optomec Co., USA) on 5 mil polyimide film 335, 365 (Kapton FPC, DuPont Co., USA). The BST/COC ink 315, 345 with was printed an micro-dispensing printer (Microplotter II, Sonoplot Co., USA). After printing with the ink, a curing process is required at temperatures below 200° C. Thermogravitational Analysis (TGA) showed 70 vol. % BST loadings in COC.

Figure 4A:
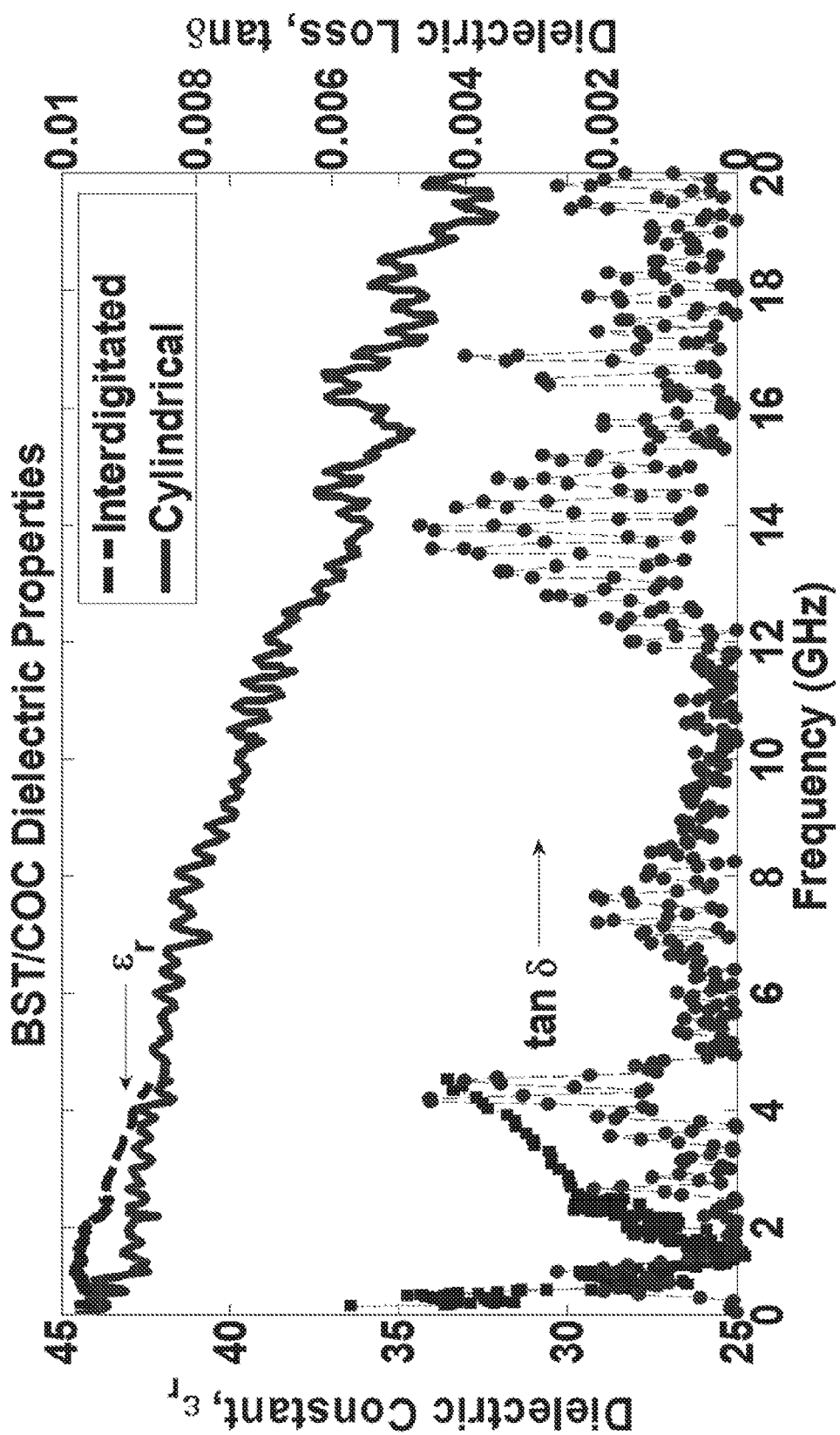
FIG. 4A is a graph that shows the dielectric constant including extracted relative permittivity and loss tangent as a function of frequency for printed cylindrical and CPW-IDC varactors with BST/COC ink.
Figure 4B:
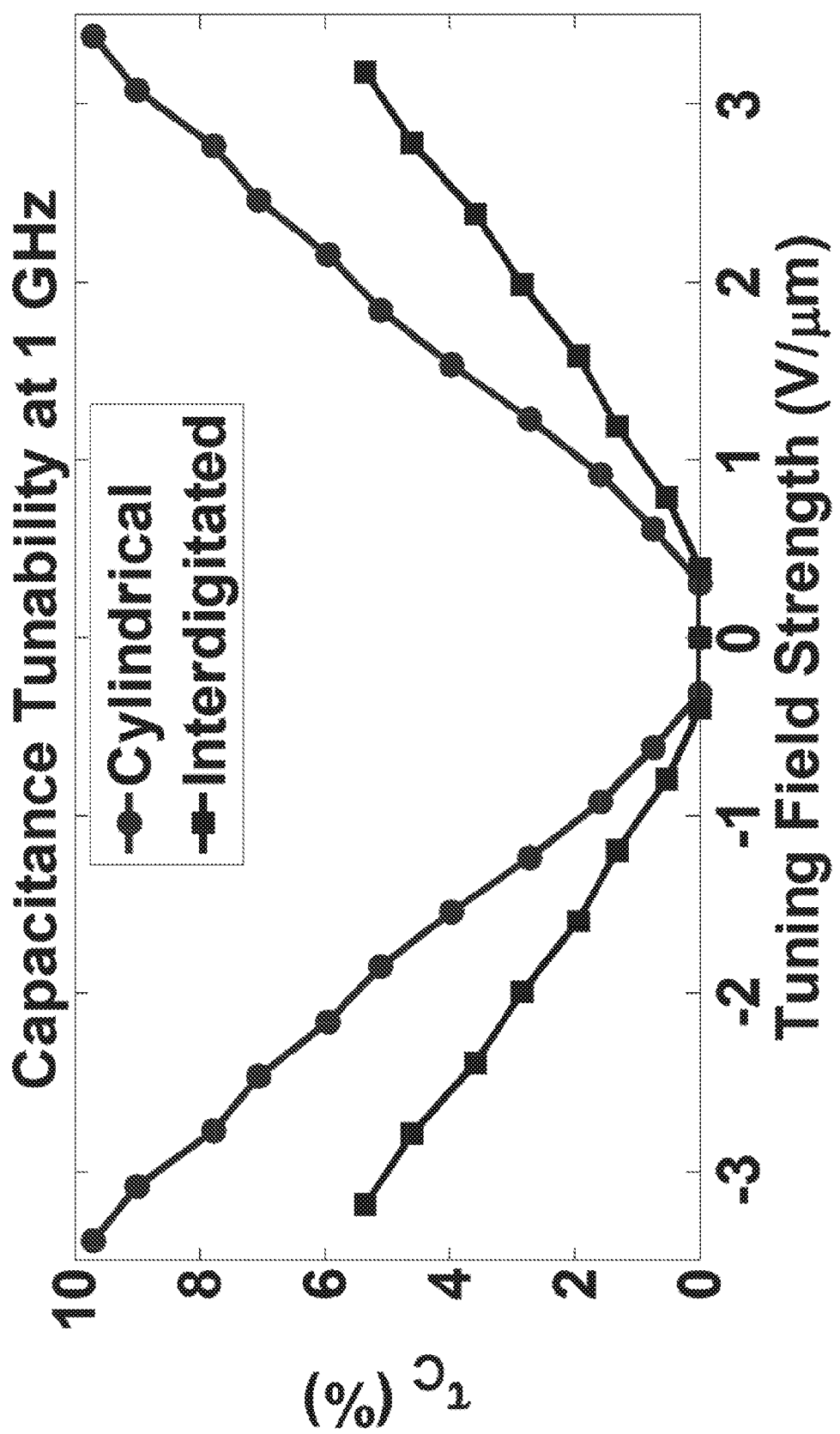
FIG. 4B is a graph that shows capacitance tunability as a function of applied electric strength as a function of field strength for printed cylindrical and CPW-IDC varactors with BST/COC ink.

An HP8510C Vector Network Analyzer (VNA) was used to measure reflection S-parameters from 45 MHz to 20 GHz using a 850 µm pitch GSG probe. An effective RF dielectric characterization method based on printed electronics was used for determining the relative permittivity and dielectric loss of direct-ink printed dielectrics. The extracted $\varepsilon_r$ and tan δ for BST/COC with 70 vol. % BST loading as a function of frequency using cylindrical and CPW-IDC varactors are shown in FIG. 4A. Based on the characterization results using the cylindrical varactor, the dielectric has a relative permittivity of around 40 at 10 GHz, and decreases to 35 at 20 GHz. The decrease in permittivity as frequency increases is a typical characteristic of BST. The loss tangent is below 0.002 in the measured frequency range and it is 0.0005 at 10 GHz. This loss factor is much less than that of ceramic BST (typically 0.02) and can be attributed to COC which has a dielectric loss of 0.0001 at 10 GHz. Similar results are observed by CPW-IDC; however, the frequency coverage of the IDC varactor is limited due to the resonances. For tunability measurements, a bias tee was used in order to superimpose the DC signal on the RF signal generated by the VNA. Once capacitance values were extracted as function of applied voltage, the capacitance tunability, can be calculated according to: $T_C=(C(0)-C(E))/C(0)\times 100\%$. Tunability results for cylindrical and IDC varactors are plotted in FIG. 4B, which shows up to 10% tunability at 1 GHz with up to 3 V/µm applied electric field strength.

All-Printed Phase Shifters

Figure 5A:
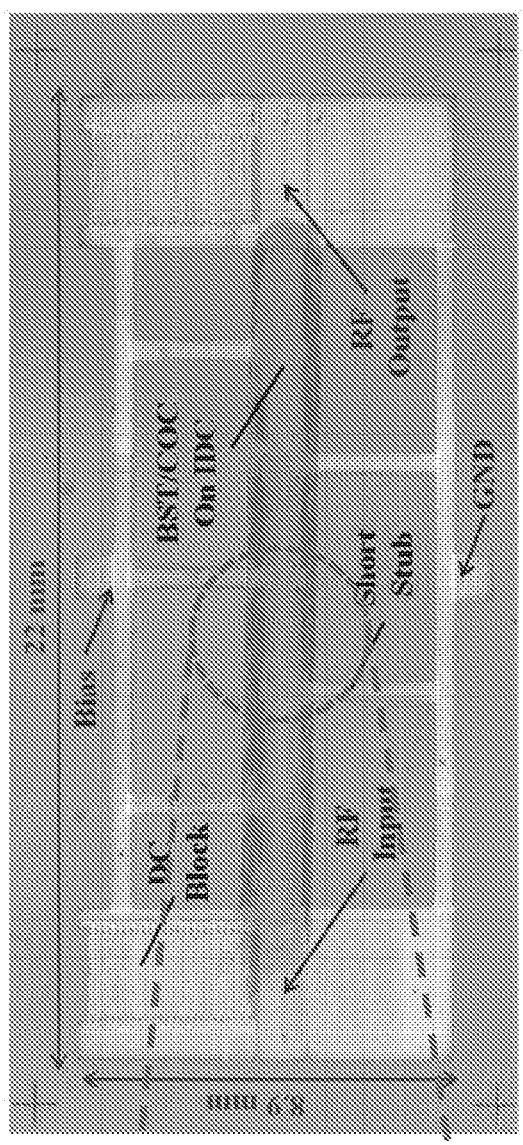
FIG. 5A is an image of a printed LHTL phase shifter with BST/COC ink.
Figure 5B:
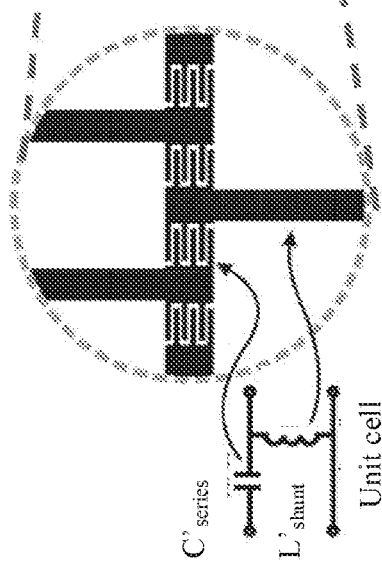
FIG. 5B is an image of a unit cell of the printed LHTL phase shifter that illustrates how the LC structure of the phase shifter is constructed.
Figure 5C:
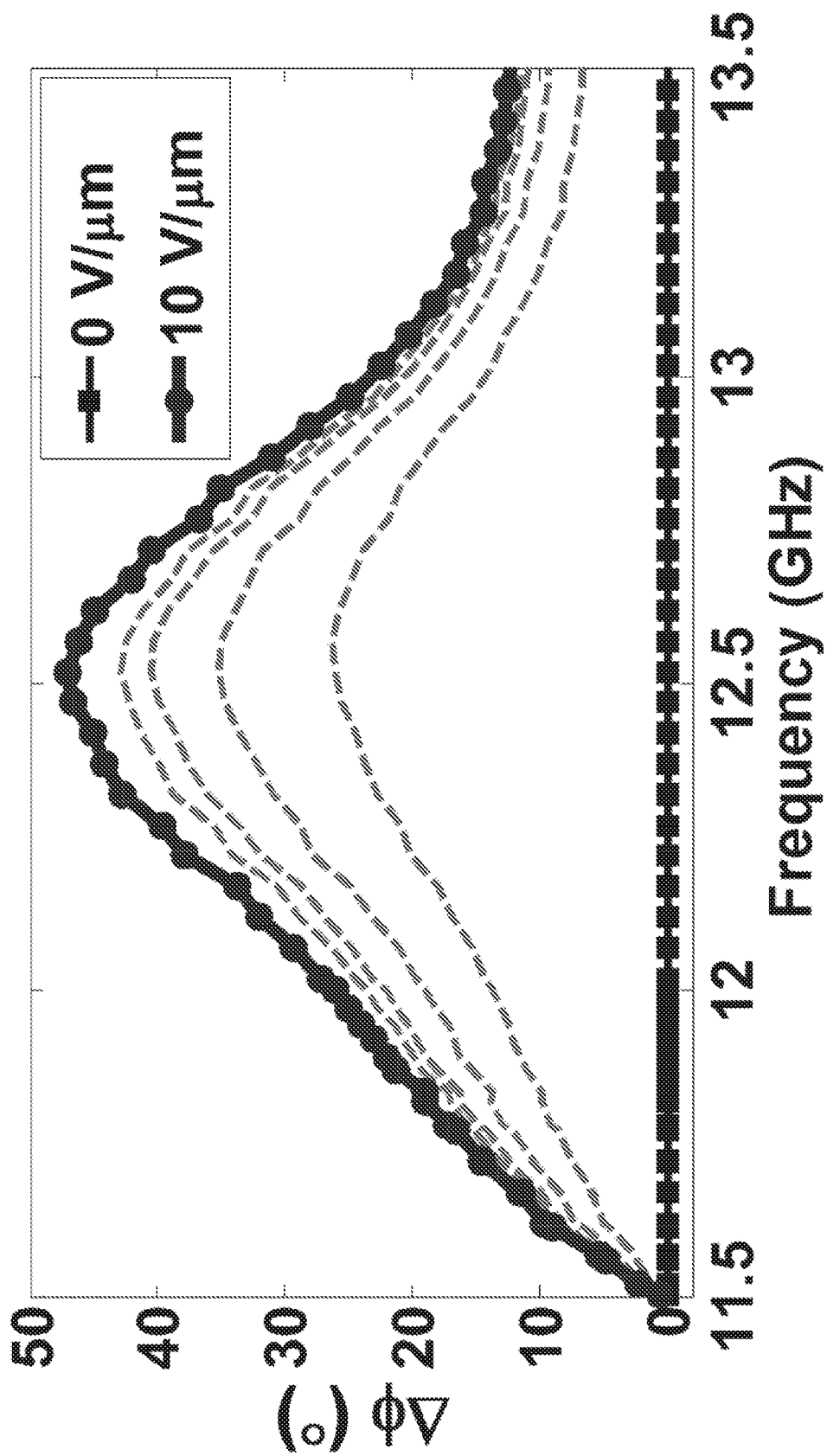
FIG. 5C is a graph that shows the measured phase shift versus frequency as a function of applied electric field strength from 0 to 10V/μm for the device illustrated in FIG. 5A.

To utilize the ferroelectric BST/COC dielectric for phase shifting, we adapt a high performance LHTL phase shifter design, which is comprised of a series of interdigitated capacitors (IDCs) loaded with shunt short stubs as illustrated in FIG. 5B. A printed sample is shown in FIG. A4A. BST/COC dielectric is directly printed on the finger of series IDCs. Two port RF measurements were performed and the phase shift as a function of applied voltage was obtained as the difference in the phase of the transmitted signal according to: $\Delta\phi=\phi\angle S_{21}(0)-\phi\angle S_{21}(V_{dc})$. The measured phase shift results are shown in FIG. 5C for various applied field strengths. Up to 48° in phase shift was achieved at 12.5 GHz. The achieved phase, although limited due to a less optimized design, represents the capability of the printed tunable BST/COC material, as well as serving as another direct validation of the electrostatic tunability properties of the material. This LHTL phase shifter exhibits an inverse propagation constant, given by $$\gamma_{LHTL} = \frac{1}{\gamma_{RHTL}} = \frac{1}{j\omega\sqrt{LC}}.$$

CPW-LHTL with Twelve IDCs

Figure 6A:
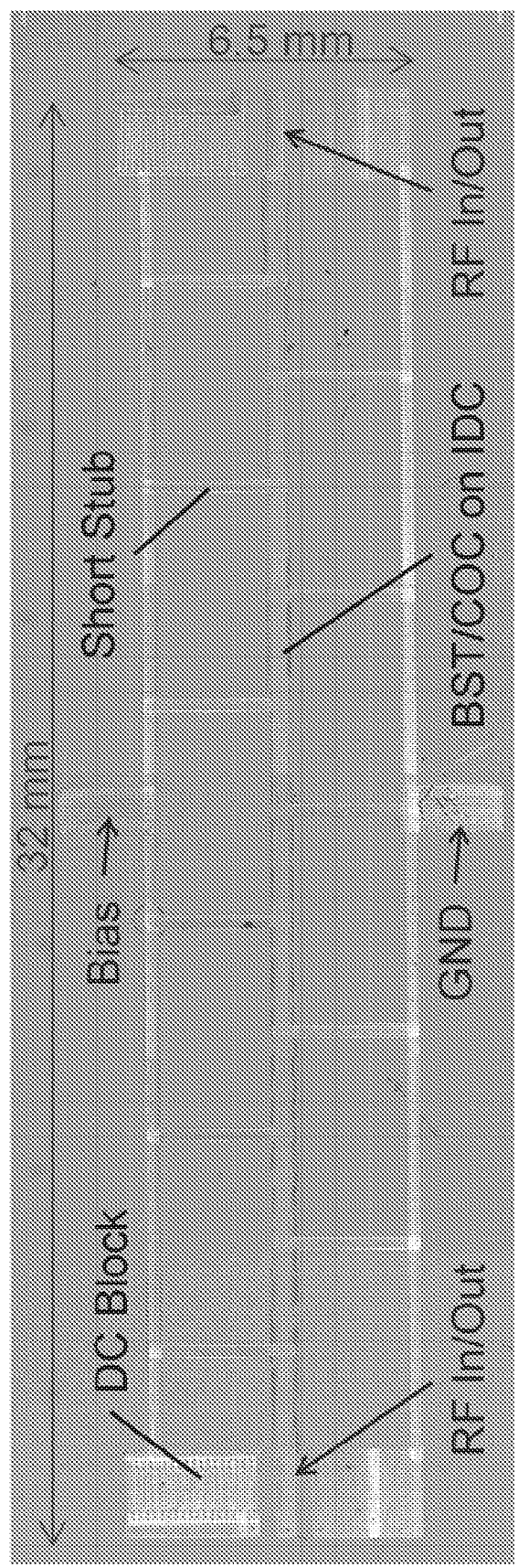
FIG. 6A is a schematic diagram of an all-printed CPW-LHTL phase shifter based on printed BST/COC dielectric with 12 IDCs.

FIG. 6A is a schematic diagram of an all-printed CPW-LHTL phase shifter based on printed BST/COC dielectric with 12 IDCs.

Figure 6B:
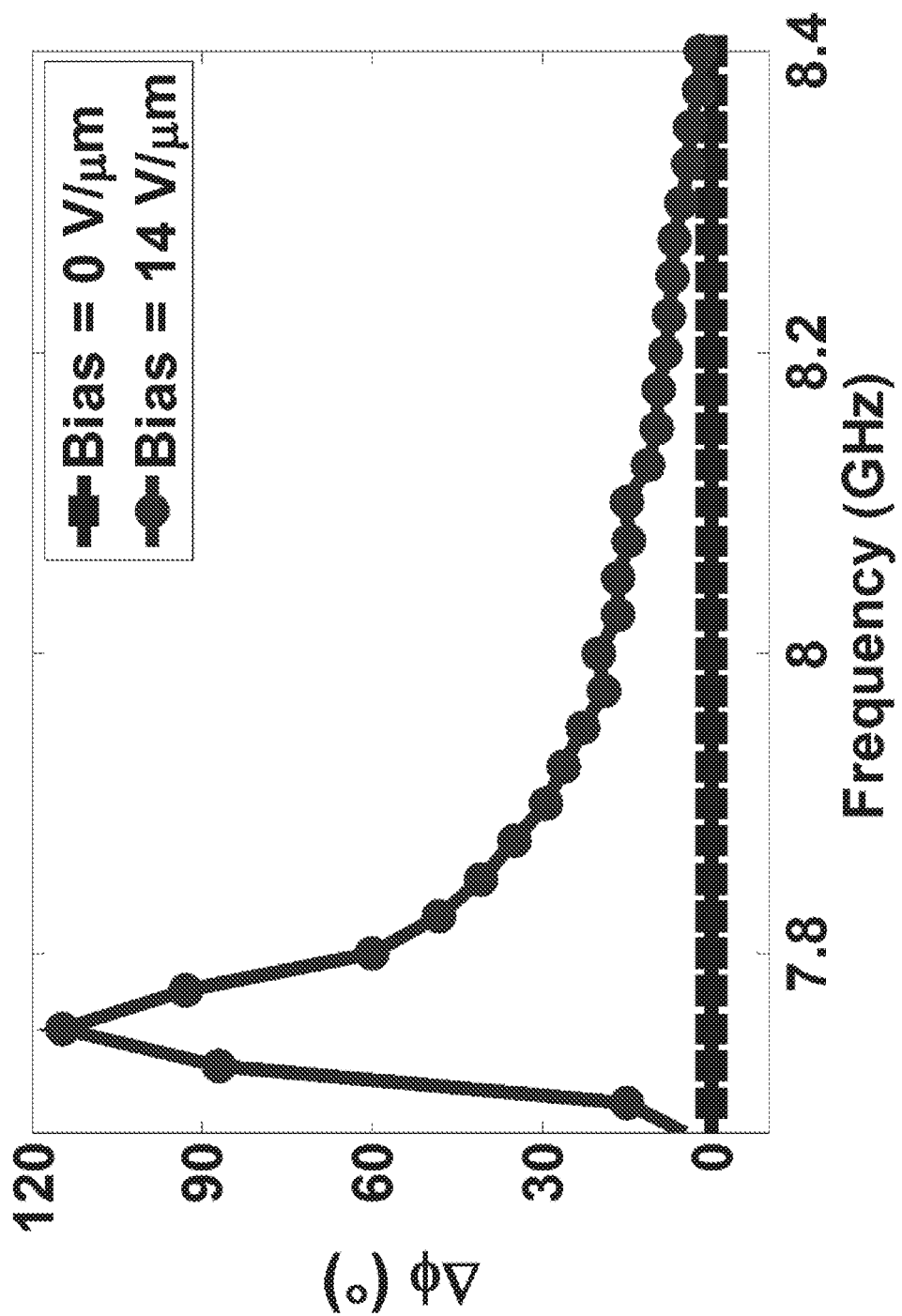
FIG. 6B is a graph of the phase difference as a function of frequency with up to 120° phase shift for the device shown in FIG. 6A.

FIG. 6B is a graph of the phase difference as a function of frequency with up to 120° phase shift for the device shown in FIG. 6A.

In order to improve the performance of the CPW-LHTL phase shifter discussed in the previous section, a new BST/COC based phase shifter was with 12 IDCs and 13 short stubs. The IDCs have four interdigitated fingers, each with a width, length, and height of 55 µm, 2000 µm, and 4 µm, respectively. The gap between IDC fingers was 25 µm. The stubs were 250 µm in width and 3000 µm in length. A printed sample of the phase shifter with marked elements is shown in FIG. 6A.

The phase shift for a phase shifter is defined as the difference in the phase of the transmitted RF signal, $S_{21}$, according to:

$$\Delta\phi=\angle S_{21}(0)-\angle S_{21}(E),$$

where $\angle S_{21}(0)$ and $\angle S_{21}(E)$ are the phase of transmitted signal in untuned and tuned states. The Figure of Merit (FOM) is defined as the phase shift divided by the magnitude of the insertion loss in the untuned state according to:

$$FoM = \frac{\Delta\phi}{IL_{Max}} = \frac{\angle S_{21}(0) - \angle S_{21}(E)}{|S_{21}(0)|}.$$

FIG. 6B shows the plot of the phase shift as a function frequency for untuned state with no bias applied and the maximum tuned state with an applied field strength of E=14V/µm. A maximum phase shift of $\Delta\phi=115°$ is obtained at f=7.75 GHz.

Fully Printed Phased Array Antenna

Figure 7A:
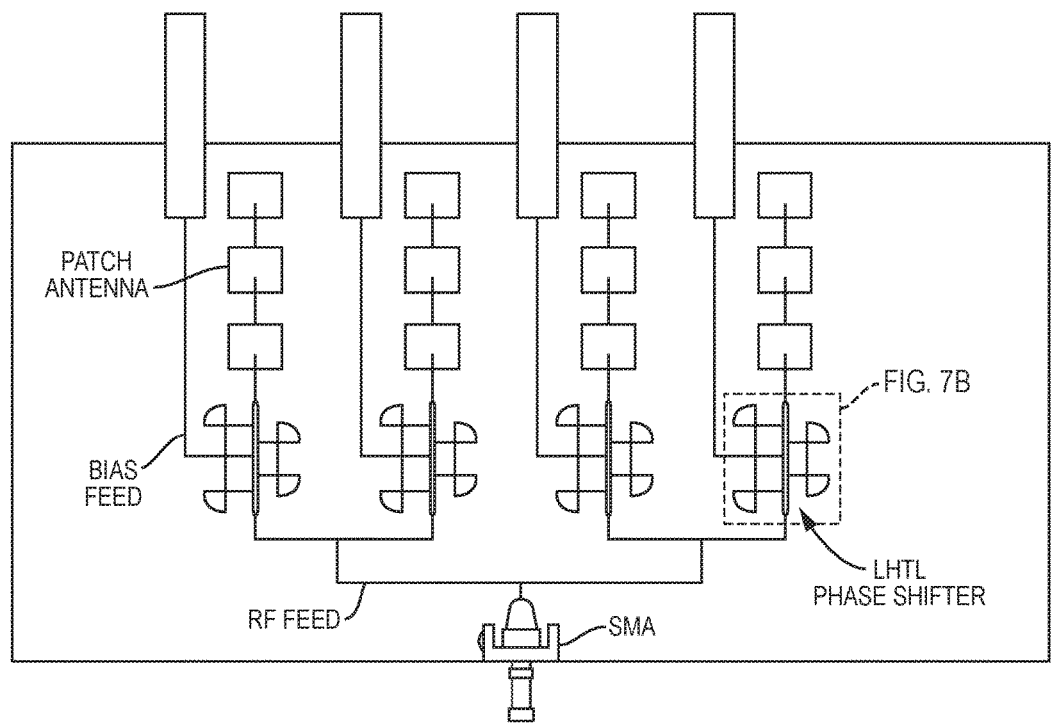
FIG. 7A is an image of a prototype of a novel all-printed phased array antenna based on LHTL phase shifters using ferroelectric BST/COC nanocomposites. The phase array comprises 3×4 rectangular patch antennas, a bias circuitry and an RF distribution network.
Figure 7B:
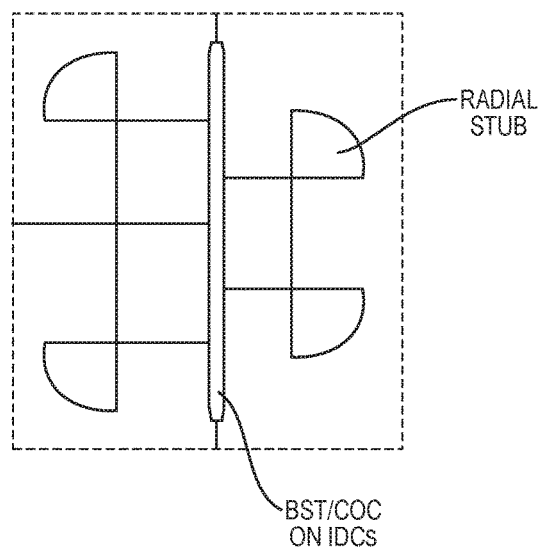
FIG. 7B is an enlarged view of a microstrip LHTL phase shifter which has series BST/COC based interdigitated capacitors (IDCs) and shunt short stubs connected to radial stubs. Bias pads are shown with marked bias voltage levels.

We have described a ferroelectric BST nano-ink and printed tunable sinterless BST/COC dielectrics. Utilizing this ferroelectric dielectric, we have created fully printed varactors. The BST/COC filled IDC varactors were combined with inductive stubs in a LHTL design to fabricated all-printed phase shifters. All of these material and devices can be integrated in one device, i.e. a fully printed phased array antenna. The prototype of a novel all-printed phased array antenna based on LHTL phase shifters using ferroelectric BST/COC nanocomposites is shown in FIG. 7A. The array comprises 3×4 rectangular patch antennas, a bias circuitry and an RF distribution network fed by an SMA connector. The inter-element spacing between two adjacent columns of radiating patch elements is d=25 mm that is less than λ/2 (i.e. λ/2=30 mm with maximum operating frequency of f=5 GHz). This design restriction is applied to avoid grading lobes in the radiation pattern of the antenna. An enlarged view of a microstrip LHTL phase shifter is also shown with series BST/COC based interdigitated capacitors (IDCs) and shunt short stubs connected to radial stubs. Bias pads are shown with marked bias voltage levels. The microstrip BST/COC based phase shifter comprises six IDCs and seven short stubs. Each IDC has four interdigitated fingers, each with a width, length, and height of 50 µm, 2000 µm, and 2 µm, respectively, as shown in FIG. 7B. The gap between IDC fingers was 50 µm. The stubs were 300 µm in width and 4000 µm in length. The radials stubs have a radius of 3300 mm and angle of 75°.

Figure 8:
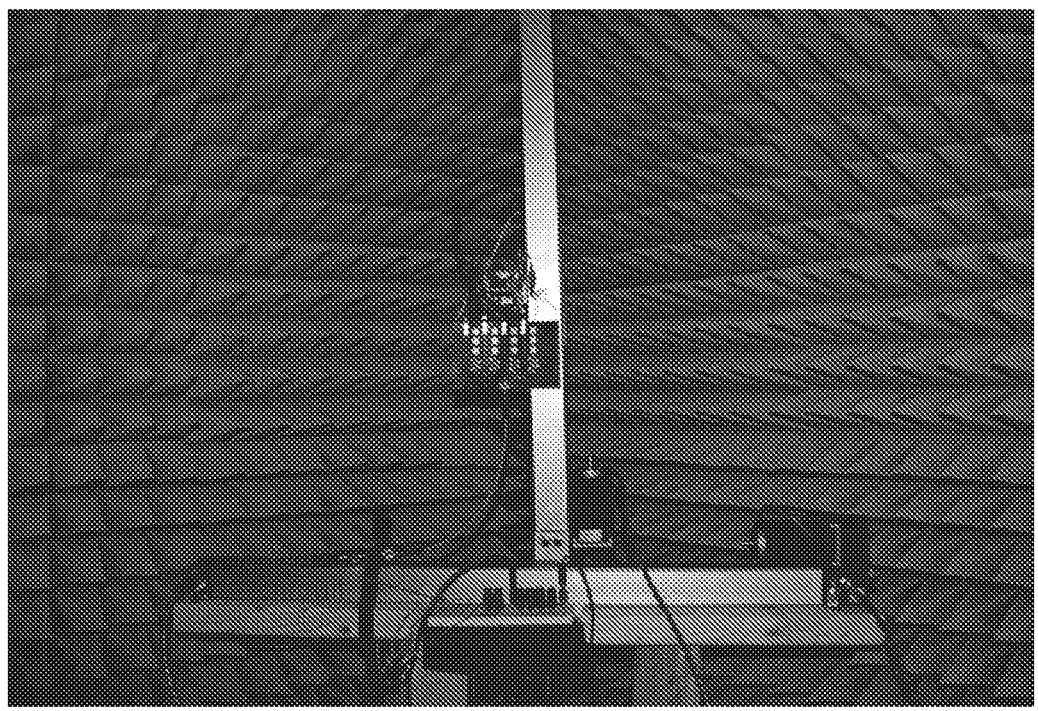
FIG. 8 is an image of the measurement setup in an anechoic chamber. The all-printed phased array is tested by operating it as a transmitting antenna. The bias circuitry is made of 4 resisters in a voltage divider configuration.
Figure 9A:
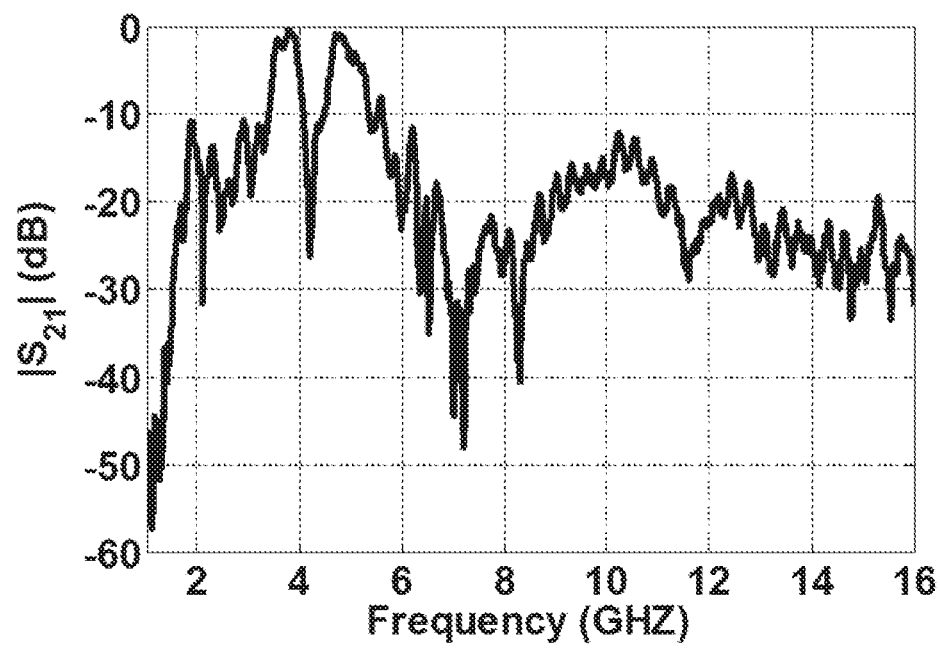
FIG. 9A is a graph showing the normalized transmission loss, ISA, in dB as a function of frequency for the all-printed phased array antenna using BST/COC based microstrip LHTL phase shifters.
Figure 9B:
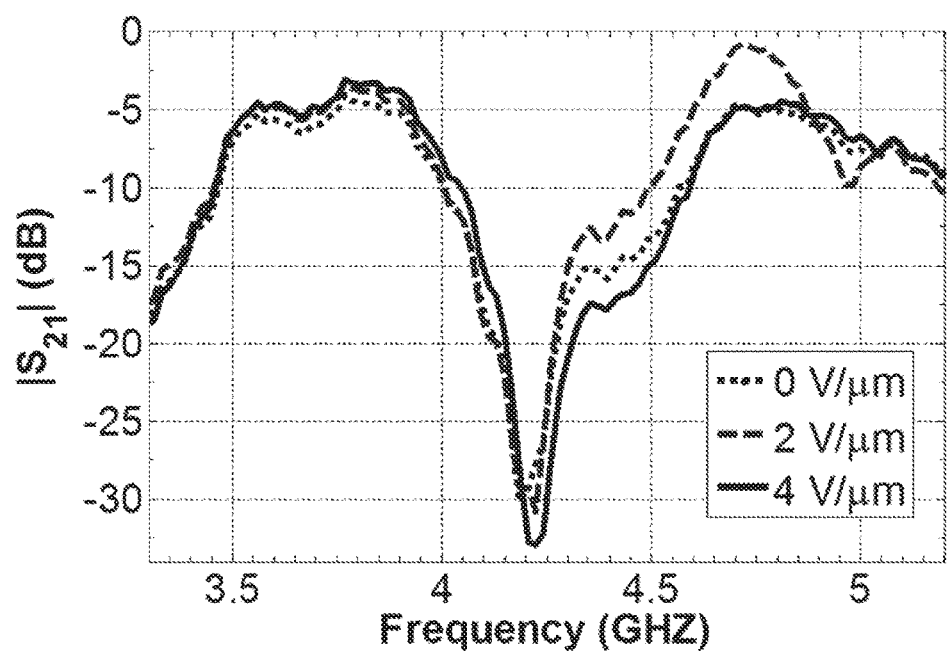
FIG. 9B is a graph showing the normalized transmission loss, ISA, in dB as a function of frequency for various applied bias fields for the all-printed phased array antenna using BST/COC based microstrip LHTL phase shifters.

The printed prototype was measured in an anechoic chamber as shown in FIG. 8. The all-printed phased array is tested by operating it as a transmitting antenna in a frequency range of 1 GHz to 16 GHz. The bias circuitry is made of four resistors in a voltage divider configuration that divides the biased voltage by factors of two and four. The primary measured results for the all-printed phased array antenna are shown in FIG. 9A and FIG. 9B. FIG. 9A shows the normalized transmission loss, ISA, in dB as a function of frequency in normal accident. It can be seen that the highest transmissions occur in the frequency range between 3.5 GHz and 5.5 GHz with peaks at $f_1$=3.75 GHz and $f_2$=4.72 GHz. FIG. 9B shows the normalized transmission loss, ISA, in dB as a function of frequency for various applied bias fields. The measured gain results under biased fields show that the gain of antenna is decreased or increased due to the applied voltage. Since this is at only normal incident (i.e. zero azimuth and elevation angles), the steering of the main lobe of the gain can be inferred from the change in the gain levels at a fixed frequency an electric field is applied. A maximum of 3.95 dB increase in the gain was observed at $f_2=4.72$ GHz with a biased field strength of E=3 V/µm. Table 4 shows the changes in gain for the $f_1$ and $f_2$ for different applied fields.

TABLE 4

| Field (V/µm) | $f_1 = 3.75$ GHz | | $f_2 = 4.72$ GHz | |
| --- | --- | --- | --- | --- |
| | Gain (dB) | Gain Change | Gain | Gain Change |
| 0 | −4.087 | 0 | −4.756 | 0 |
| 2 | −3.297 | +0.79 | −4.893 | +0.137 |
| 4 | −3.041 | +1.046 | −0.8128 | +3.943 |

Fully printed varactors on flexible substrates with up to $\tau_C=10\%$ dielectric tunability at 1 GHz were realized. The sinter-less tunable dielectric based on multiphase a BST/COC ink was directly printed on a flexible substrate. The unprecedented dielectric tunability reported here was achieved by fine-tuning three inter-correlated parameters: Ba mole ratio (or x) in $Ba_xSr_{1-x}TiO_3$, BST particle size, and BST loading fraction. In particular, it was found that the Ba/Sr ratio of the BST particles had to be increased to compensate for BST size effects. BST/COC dielectric yields a very high dielectric constant of 48 and a very low loss tangent of 0.0005 at 10 GHz. As a first demonstration of a working device from this new ink, an LHTL phase shifter was printed and measured.

Applications

The BST inks can be used to fabricate many different types of devices. Examples include fully printed, high frequency, electrostatically variable capacitors (varactors), including those made with parallel-plate (MIM) structure and in-plane structure; fully Printed RF and Microwave devices, including tunable phase shifters, frequency-agile Frequency Selective Surfaces (FSS), phase array antennas, adaptive and reconfigurable antennas, and voltage controlled Oscillators (VCO). The devices made with such inks can be used to provide impedance matching. Examples of devices that can be made also include high permittivity, low loss insulators at RF and Microwave frequencies and devices having permittivity that is adjustable by BST loading.

Definitions

Any reference in the claims to an electronic signal or an electromagnetic signal (or their equivalents) is to be understood that in a preferred embodiment the signal is a non-transitory electronic signal or a non-transitory electromagnetic signal. If the signal per se is not claimed, the reference may in some instances be to a description of a propagating or transitory electronic signal or electromagnetic signal.

INCORPORATION BY REFERENCE

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. An apparatus comprising:
    a first electrode;
    a second electrode; and
    a filler material disposed between the first electrode and the second electrode, the filler material including a plurality of pre-sintered perovskite oxide particles comprising Barium Strontium Titanate (BST); and
    wherein the filler material is an electrically tunable dielectric material tunable at frequencies above 1 GigaHertz.

2. The apparatus as in claim 1, wherein the first electrode is a first electrically conductive structure and the second electrode is a second electrically conductive structure, at least one of the first electrically conductive structure and the second electrically conductive structure being coupled to a substrate, the first electrically conductive structure and the second electrically conductive structure each having at least one terminal, the first electrically conductive structure and the second electrically conductive structure spaced apart from each other so as to define a channel in which the filler material resides.

3. The apparatus of claim 1 further comprising:
    a flexible substrate, the first electrode, and the second electrode disposed on the flexible substrate.

4. The apparatus of claim 1, wherein the apparatus is configured to operate under application of a tunable radio frequency signal.

5. The apparatus of claim 1, wherein the apparatus is configured to operate under application of a tunable microwave signal.

6. The apparatus of claim 2, wherein the first electrically conductive structure and the second electrically conductive structure are disposed in a common plane on a substrate, the filler material disposed on the substrate in between the first electrically conductive structure and the second electrically conductive structure.

7. The apparatus of claim 6, wherein the first electrode and the second electrode are interdigitated layers of electrically conductive material disposed on the substrate.

8. The apparatus of claim 2, wherein the first electrode and the second electrode are disposed in different parallel planes.

9. The apparatus of claim 1, wherein the apparatus is of a type selected from the group consisting of: a varactor, a tunable phase shifter, a reconfigurable antenna, an adaptive antenna, a steerable phased array, a tunable filter, a tunable Frequency Selective Surface (FSS), a tunable match line, a tunable Substrate Integrated Waveguide (SIW), and a Voltage Controlled Oscillator (VCO).

10. The apparatus as in claim 1, wherein the plurality of pre-sintered perovskite oxide particles have a size distribution with a modal size in the range of 30 nanometers to 2000 nanometers.

11. The apparatus as in claim 1, wherein the filler material further comprises:
    a polymer; and
    a solvent operable to dissolve the polymer in the filler material.

12. The apparatus as in claim 1, wherein the filler material further comprises:
a dispersant to disperse the pre-sintered perovskite oxide particles.

13. The apparatus as in claim 1, wherein the pre-sintered perovskite oxide particles comprise BaxSr(1-x)TiO3, with x in the range of $0.0 \leq x \leq 1.0$.

14. The apparatus as in claim 1, wherein the polymer is a polymer selected from the group of polymers consisting of Topas Cyclic Olefin Copolymer, PTFE (Teflon), silicone rubber, butyl-rubber, epoxy resin, polymethylmethacrylate (PMMA), polyphenylene sulfide (PPS), Polystyrene (PS), Polyethylene (PE), Parylene C & N, and olypropylene-graft-poly(styrene-stat-divinylbenzene) (ER).

15. The apparatus as in claim 11, wherein the solvent is a solvent selected from the group of solvents consisting of xylene, toluene, and Tetrahydrofuran (THF).

16. The apparatus of claim 1, wherein the filler material is electrically tunable.

17. The apparatus as in claim 1 further comprising:
a substrate; and
wherein the first electrode, the second electrode, and the filler material are disposed on the substrate.

18. The apparatus as in claim 1, wherein dielectric properties of the filler material vary depending on an electric field applied to the filler material.

19. The apparatus as in claim 1, wherein a modal size of the plurality of the pre-sintered perovskite oxide particles in the filler material is correlated with a tunable response of the apparatus.

20. The apparatus as in claim 1, wherein the plurality of the pre-sintered perovskite oxide particles are suspended in the filler material.

21. The apparatus as in claim 20, wherein the filler material includes a polymer in which the pre-sintered perovskite oxide particles are suspended.

22. The apparatus as in claim 1, wherein the filler material is ink dispensed via printing on a substrate.

23. The apparatus as in claim 20, wherein the filler material includes a dispersant to disperse the pre-sintered perovskite oxide particles in the filler material.

24. The apparatus as in claim 1, wherein an applied electric field controls an orientation of the pre-sintered perovskite oxide particles in the filler material.

25. An apparatus comprising:
a first electrode;
a second electrode;
a filler material disposed between the first electrode and the second electrode, the filler material comprising a plurality of pre-sintered perovskite oxide particles; and
wherein the filler material further comprises: a polymer having a low loss tangent of less than 0.001.

26. An apparatus comprising:
a first electrode;
a second electrode;
a filler material disposed between the first electrode and the second electrode, the filler material including a plurality of pre-sintered perovskite oxide particles comprising Barium Strontium Titanate (BST);
wherein the first electrode is a first electrically conductive structure and the second electrode is a second electrically conductive structure, at least one of the first electrically conductive structure and the second electrically conductive structure being coupled to a substrate, the first electrically conductive structure and the second electrically conductive structure each having at least one terminal, the first electrically conductive structure and the second electrically conductive structure spaced apart from each other so as to define a channel in which the filler material resides; and
wherein the pre-sintered perovskite oxide particles comprise BaxSr(1-x)TiO3, with x in the range of $0.5 \leq x \leq 0.7$.

27. The apparatus as in claim 26, wherein the filler material is an electrically tunable dielectric material tunable at frequencies above 1 GigaHertz.

28. An apparatus comprising:
a first electrode;
a second electrode;
a filler material disposed between the first electrode and the second electrode, the filler material including a plurality of pre-sintered perovskite oxide particles comprising Barium Strontium Titanate (BST);
wherein the filler material further comprises: a dispersant to disperse the pre-sintered perovskite oxide particles; and
wherein the dispersant is 4-tert-butycatechol.

* * * * *